(12) United States Patent
Baker

(10) Patent No.: US 6,822,510 B1
(45) Date of Patent: Nov. 23, 2004

(54) POWER-OFF, LOOP-THROUGH RETURN-LOSS WITH NEGATIVE CAPACITANCE

(75) Inventor: Daniel G. Baker, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 10/428,670

(22) Filed: May 1, 2003

(51) Int. Cl.[7] .............................. H03F 3/45; H03F 1/14
(52) U.S. Cl. ...................... 330/69; 330/104; 330/292
(58) Field of Search ...................... 330/69, 103, 104, 330/112, 292; 348/707

(56) References Cited

U.S. PATENT DOCUMENTS

| | | | | |
|---|---|---|---|---|
| 4,494,146 A | * | 1/1985 | Naimpally et al. | 348/707 |
| 6,369,650 B1 | * | 4/2002 | Hayat-Dawoodi | 330/69 |
| 6,624,699 B2 | * | 9/2003 | Yin et al. | 330/260 |

* cited by examiner

*Primary Examiner*—Steven J. Mottola
(74) *Attorney, Agent, or Firm*—Francis I. Gray

(57) ABSTRACT

An improved power-off, loop-through return-loss characteristic for a current feedback operational amplifier is provided by adding a positive feedback capacitor between the input and output of the operational amplifier. The positive feedback capacitor results in a negative capacitance input impedance for the operational amplifier that cancels stray capacitances at the input.

1 Claim, 1 Drawing Sheet

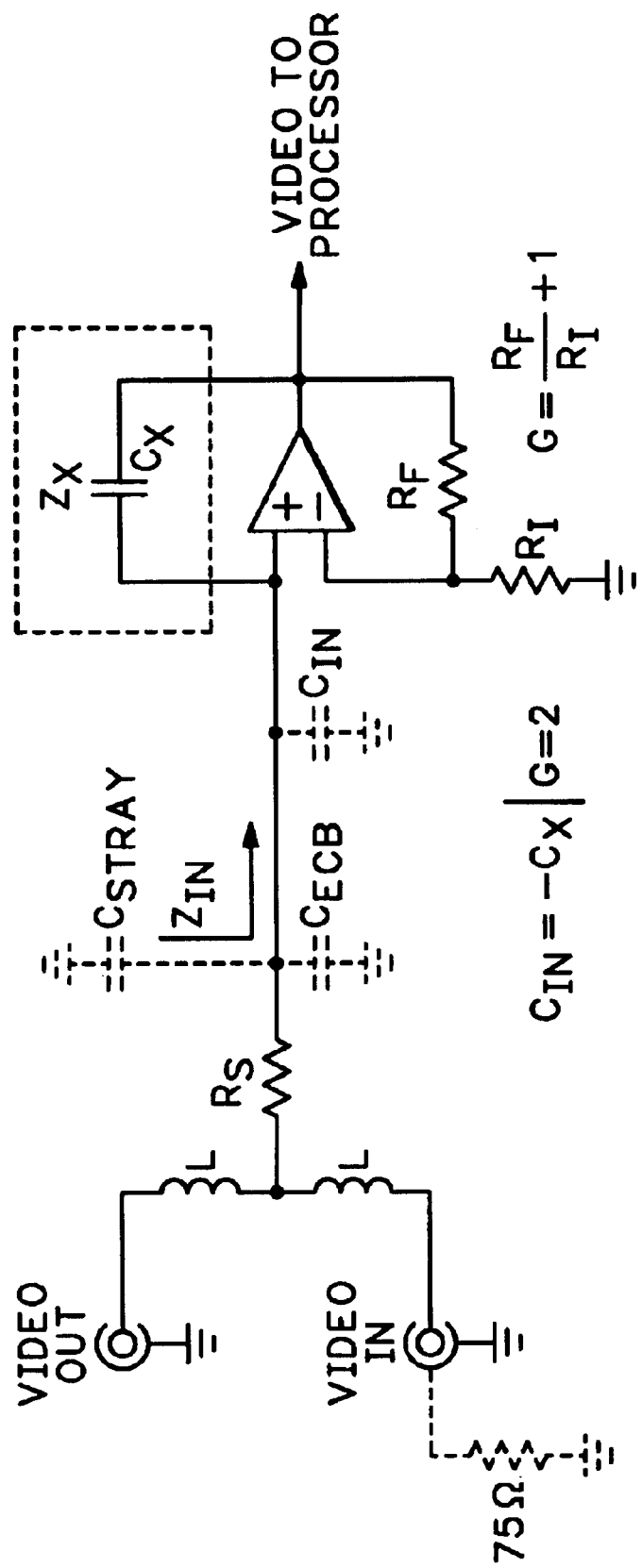

POWER-OFF, LOOP-THROUGH RETURN-LOSS WITH NEGATIVE CAPACITANCE

BACKGROUND OF THE INVENTION

The present invention relates to passive loop-through of signals in signal processing equipment, and more particularly to an improved power-off, loop-through return-loss with negative capacitance for a video monitoring instrument.

Current analog and some digital video inputs of waveform monitors and other video processing equipment are required to have a passive loop-through characteristic to allow cascading of equipment on a single video cable run, This reduces the need for analog and digital distribution amplifiers (DAs) and allows a waveform monitor (WFM) access to the physical signal—eye-pattern, jitter, etc.—passed down-stream to subsequent video equipment inputs. It is important that the WFM and other video devices be non-invasive to the video signal even when the WFM is powered off. This requires a high, large-signal return-loss, typically greater than 40 dB, in both the "on" and "off" power condition. A robust method is to isolate a high impedance input amplifier with a resistor to provide good return-loss and electro-static discharge (ESD) protection. Typically the resistor must be greater than or equal to 7500 ohms to attain the desired return-loss and ESD protection. However this creates a dominant pole at 2–5 MHz with the electronic circuit board (ECB) run capacitance and device input capacitance. The bandwidth is too low.

What is desired is a way to allow the resistor to be greater than 7500 ohms needed to meet the 40 dB return-loss specification and not reduce the bandwidth due to the stray input capacitance below a desired 100 MHz or higher.

BRIEF SUMMARY OF THE INVENTION

Accordingly the present invention provides an improved power-off, loop-through return-loss for an instrument by adding a positive feedback capacitor, corresponding to negative input capacitance, to cancel stray capacitance and extend a dominant input pole to 100 MHz or higher.

The objects, advantages and other novel features of the present invention are apparent from the following detailed description when read in conjunction with the appended claims and attached drawing.

BRIEF DESCRIPTION OF THE SEVERAL VIEWS OF THE DRAWING

FIG. 1 is a schematic view of an improved loop-through circuit according to the present invention.

DETAILED DESCRIPTION OF THE INVENTION

Referring now to FIG. 1 a video loop-through is shown having a 75 ohm input terminal and an output terminal coupled together so that a video signal applied to the input terminal is routed to the output terminal with a non-invasive impact on the video signal. Inductors L may be inserted between the input and output terminals and an input signal run. The input terminal is coupled through a source resistor $R_s$ to one input of an operational amplifier U1. The output from the operational amplifier U1 is coupled back to the other input of the operational amplifier via a voltage divider network of a feedback resistor $R_f$ and an input resistor $R_i$ to provide current feedback. At the input to the operational amplifier U1 there is stray run capacitance $C_{ECB}$ and stray shunt capacitance $C_{stray}$. The video signal output from the operational amplifier U1 is provided for further processing by a video processor of some sort. The operational amplifier U1 typically has a greater than 200 MHz closed loop bandwidth.

Added to the operational amplifier U1 is a positive feedback capacitor $Z_X$ between the output and the first input. The gain $G_{DC}$ of the operational amplifier U1 in the power off condition is:

$$G_{DC}=1+R_f/R_i$$

and the input impedance $Z_{in}$ is:

$$Z_{in}=Z_X/(1-G_{DC})$$

In other words for $Z_x=1/j\omega 10$ pF and $G_{dc}=2$, $Z_{in}=1/j\omega(-10$ pF$)$. This negative capacitance at the input to the operational amplifier U1 cancels or nearly cancels the stray capacitance $C_{ECB}$ and other stray shunt capacitance, $C_{stray}$. This is due to the input capacitance $C_{IN}$ being in parallel with $C_{ECB}$ and $C_{stray}$. $C_T=C_{ECB}+C_{stray}+C_{IN}=+10$ pF$+(-10$ pF$)\cong 0$. The result is that the dominant input pole is extended to 100 MHz or higher instead of being between 2–5 MHz as in the prior art while still providing a return-loss of greater than or equal to 40 dB. The circuit remains stable as long as the total capacitance $C_T$ is positive, i.e., $|C_{IN}|<(C_{ECB}+C_{stray})$.

Thus the present invention provides improved power-off, loop through return-loss characteristic for a signal processing instrument having an input current feedback operational amplifier by adding a positive feedback capacitor to provide negative input capacitance that cancels stray run and input capacitances of the operational amplifier circuit.

What is claimed is:

1. An improved power-off, loop-through return-loss circuit for a current feedback operational amplifier of the type having an input signal terminal and a loop-through output signal terminal coupled to an input of the operational amplifier via a source resistor, the improvement comprising coupling a positive feedback capacitor between the input and an output of the operational amplifier to provide a negative capacitance at the input of the operational amplifier to cancel stray capacitances at the input.

* * * * *